United States Patent
Oh et al.

(10) Patent No.: US 9,432,037 B2
(45) Date of Patent: Aug. 30, 2016

(54) APPARATUS AND METHOD FOR ANALOG-DIGITAL CONVERTING

(71) Applicants: Seung-Hyun Oh, Seoul (KR); Jong-Woo Lee, Seoul (KR); Thomas Byung-Hak Cho, Gyeonggi-do (KR)

(72) Inventors: Seung-Hyun Oh, Seoul (KR); Jong-Woo Lee, Seoul (KR); Thomas Byung-Hak Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/924,949

(22) Filed: Oct. 28, 2015

(65) Prior Publication Data

US 2016/0126967 A1 May 5, 2016

Related U.S. Application Data

(60) Provisional application No. 62/075,610, filed on Nov. 5, 2014.

(30) Foreign Application Priority Data

Feb. 26, 2015 (KR) .......................... 10-2015-0027420

(51) Int. Cl.
| | |
|---|---|
| H03M 1/06 | (2006.01) |
| H03M 1/12 | (2006.01) |
| H03M 1/66 | (2006.01) |
| H03M 1/80 | (2006.01) |
| H03M 1/00 | (2006.01) |

(52) U.S. Cl.
CPC .................. *H03M 1/06* (2013.01); *H03M 1/12* (2013.01); *H03M 1/66* (2013.01); *H03M 1/00* (2013.01); *H03M 1/804* (2013.01)

(58) Field of Classification Search
CPC ......... H03M 1/00; H03M 1/12; H03M 1/804

USPC ................. 341/118, 155, 156, 122, 172, 110
See application file for complete search history.

(56) References Cited

U.S. PATENT DOCUMENTS

| | | | |
|---|---|---|---|
| 2010/0156685 | A1 | 6/2010 | Westwick et al. |
| 2011/0122006 | A1 | 5/2011 | Liao et al. |
| 2012/0075128 | A1 | 3/2012 | Aruga et al. |
| 2012/0212359 | A1 | 8/2012 | Lai et al. |
| 2012/0274489 | A1* | 11/2012 | Chang .................. H03M 1/462 341/110 |
| 2013/0057417 | A1 | 3/2013 | Bonaccio et al. |
| 2014/0035772 | A1 | 2/2014 | Tsal at al. |

FOREIGN PATENT DOCUMENTS

| | | |
|---|---|---|
| KR | 101253224 | 4/2013 |
| KR | 1020140057027 | 5/2014 |

* cited by examiner

*Primary Examiner* — Joseph Lauture
(74) *Attorney, Agent, or Firm* — The Farrell Law Firm, P.C.

(57) ABSTRACT

Provided is an apparatus for analog-digital converting that includes a Most Significant Bit (MSB)-Digital Analog Converter (DAC) for converting a digital signal into an analog signal, a trim capacitor, a Least Significant Bit (LSB)-DAC, coupled to the trim capacitor, for converting a digital signal into an analog signal, a bridge capacitor connecting the MSB-DAC and the LSB-DAC, a comparator for measuring a voltage value at the MSB-DAC and LSB-DAC and outputting a result of comparing with a sampled voltage value, and a controller for generating first measurement data by digital converting a first measurement value output from the comparator by applying a reference voltage to a unit capacitor of the MSB-DAC, for generating second measurement data by digital converting a second measurement value output from the comparator by applying the reference voltage to the LSB-DAC, and controlling the trim capacitor by comparing the first and second measurement data.

20 Claims, 13 Drawing Sheets

APPARATUS AND METHOD FOR ANALOG-DIGITAL CONVERTING

PRIORITY

This application claims priority under 35 U.S.C. §119(e) to a U.S. Provisional Application filed on Nov. 5, 2014 in the U.S. Patent and Trademark Office and assigned Ser. No. 62/075,610, and under 35 U.S.C. §119(a) to a Korean Patent Application filed on Feb. 26, 2015 in the Korean Intellectual Property Office and assigned Serial number 10-2015-0027420, the entire disclosure of each of which is incorporated herein by reference.

BACKGROUND

1. Field of the Disclosure

The present disclosure relates generally to an apparatus for analog to digital conversion and a method for operation thereof.

2. Description of the Related Art

A successive approximation register (SAR) analog-digital converter (ADC) is one type of low-power ADC. To use a high resolution, i.e., resolution greater than or equal to 10 bits, SAR ADC, a split-capacitor digital-analog converter (DAC) array is very effective for a small circuit area and has low-power consumption. A primary disadvantage of the split-capacitor DAC array structure is that performance thereof is highly dependent on an accurate value of a bridge capacitor. If the value of the bridge capacitor is not accurate, an error may occur. Therefore, correction of the bridge capacitor is provided for the split-capacitor DAC array structure. Accordingly, there is a need for a method of correcting the bridge capacitor.

SUMMARY

An aspect of the present disclosure provides an apparatus and method for controlling an analog-digital converter (ADC).

Another aspect of the present disclosure provides an apparatus and method for controlling a trim capacitor in a successive approximation register (SAR) ADC.

According to an aspect of the present disclosure, an apparatus for analog-digital converting is provided. The apparatus includes a most significant bit (MSB)-digital analog converter (DAC) for converting a first digital signal into a first analog signal, a trim capacitor, a least significant bit (LSB)-DAC, coupled to the trim capacitor, for converting a second digital signal into a second analog signal, a bridge capacitor for connecting the MSB-DAC and the LSB-DAC, a comparator for measuring a voltage value at the MSB-DAC and the LSB-DAC and for outputting a result of comparing with a sample voltage value, and a controller for controlling digital converting of a first measurement value output from the comparator by applying a reference voltage to a unit capacitor of the MSB-DAC to generate first measurement data and digital converting of a second measurement value output from the comparator by applying the reference voltage to the LSB-DAC to generate second measurement data.

According to another aspect of the present disclosure, a method for operating an analog-digital signal converting apparatus is provided. The method includes applying a reference voltage value to a unit capacitor of an MSB-DAC for converting a first digital signal into a first analog signal to measure a voltage output from the MSB-DAC, and for generating first measurement data by digital converting a first measurement value, applying a reference voltage value to an LSB-DAC for converting a second digital signal into a second analog signal to measure a voltage output from the LSB-DAC, and for generating second measurement data by digital converting a measurement value, and controlling a trim capacitor by comparing the first measurement data and the second measurement data.

According to a further aspect of the present disclosure, a communication device is provided that includes a modem configured to modulate a baseband signal according to a communication scheme for wireless communication, a radio frequency integrated chip and a successive approximation register analog-digital converter (SAR-ADC) provided on the radio frequency integrated chip. The SAR-ADC includes a most significant bit digital analog converter (MSB-DAC) for converting a first digital signal into a first analog signal, a least significant bit digital analog converter (LSB-DAC) for converting a second digital signal into a second analog signal, a bridge capacitor connecting the MSB-DAC and the LSB-DAC, a comparator for measuring a voltage value at the MSB-DAC and the LSB-DAC, and for outputting a result of a comparison of the measured voltage value with a sample voltage value, and a controller for controlling digital converting of a first measurement value output from the comparator by applying a reference voltage to a unit capacitor of the MSB-DAC to generate first measurement data, and digital converting of a second measurement value output from the comparator by applying the reference voltage to the LSB-DAC to generate second measurement data.

According to a further aspect of the present disclosure, a method of operating a communication device including a radio frequency integrated chip (RFIC) with a successive approximation register analog-digital converter is provided that includes modulating, by a modem of the communication device, a baseband signal according to a communication scheme for wireless communication; converting, by a most significant bit digital analog converter (MSB-DAC) of the RFIC, a first digital signal into a first analog signal; converting, by a least significant bit digital analog converter (LSB-DAC) of the RFIC, a second digital signal into a second analog signal; measuring, by a comparator of the RFIC, a voltage value at the MSB-DAC and the LSB-DAC; outputting, by the comparator, a result of a comparison of the measured voltage value with a sample voltage value; digitally converting, by a controller of the RFIC, a first measurement value output from the comparator by applying a reference voltage to a unit capacitor of the MSB-DAC to generate first measurement data; and digitally converting, by the controller, a second measurement value output from the comparator by applying the reference voltage to the LSB-DAC to generate second measurement data.

Accordingly, the present disclosure provides an apparatus, electronic communication device and method to eliminate errors that arise when a value of the bridge capacitor is not accurate.

BRIEF DESCRIPTION OF THE DRAWINGS

The above and other aspects, features and advantages of certain embodiments of the present disclosure will be more apparent from the following detailed description taken in conjunction with the accompanying drawings, in which.

DETAILED DESCRIPTION OF EMBODIMENTS OF THE PRESENT DISCLOSURE

Figure 1:
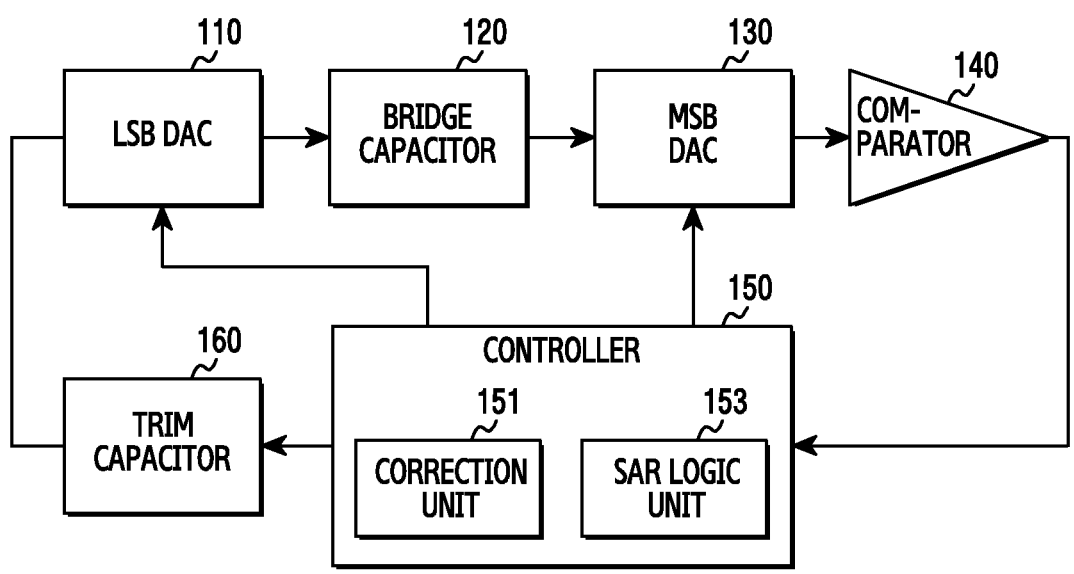
FIG. 1 is a block diagram of an apparatus for controlling an analog-digital converter (ADC) according to an embodiment of the present disclosure.

Hereinafter, various embodiments of the present disclosure are described with reference to the accompanying drawings. It should be understood, however, that it is not intended to limit the various embodiments of the present disclosure to the particular form disclosed, but, on the contrary, the various embodiments of the present disclosure cover all modifications, equivalent, and alternatives falling within the spirit and scope of the various embodiments of the present disclosure as defined by the appended claims. Like reference numerals denote like constitutional elements throughout the drawings.

The expressions "have", "may have", "include" or "may include" or the like used in the present disclosure are intended to indicate a presence of a corresponding characteristic, e.g., a number, a function, an operation, or a constitutional element such as a component, and should be understood that there are additional possibilities of one or more other characteristics.

In the present disclosure, expressions "A or B", "A and/or B", or "one or more of A and/or B" or the like may include all possible combinations of items enumerated together. For example, "A or B", "at least one of A and B", or "at least one of A or B" may indicate all cases where: (1) at least one A is included; (2) at least one B is included; and (3) at least one A and at least one B are both included.

Although expressions used in the present disclosure such as "1$^{st}$", "2$^{nd}$", "first", "second" or the like may be used to express various constitutional elements, it is not intended to limit an order and/or importance thereof. For example, a 1$^{st}$ user device and a 2$^{nd}$ user device may indicate different user devices irrespective of an order or importance thereof. For example, a 1$^{nd}$ constitutional element may be referred to as a 2$^{nd}$ constitutional element, and similarly, the 2$^{nd}$ constitutional element may be referred to as the 1$^{st}$ constitutional element without departing from the scope of the present disclosure.

When a certain constitutional element, e.g., the 1$^{st}$ constitutional element, is mentioned as being "operatively or communicatively coupled with/to" or "connected to" a different constitutional element, e.g., the 2$^{nd}$ constitutional element, it is to be understood that the certain constitutional element is directly coupled with/to another constitutional element or can be coupled with/to the different constitutional element via another constitutional element, e.g., a 3$^{rd}$ constitutional element. On the other hand, when the certain constitutional element, e.g., the 1$^{st}$ constitutional element, is mentioned as being "directly coupled with/to" or "directly connected to" the different constitutional element, e.g., the 2$^{nd}$ constitutional element, it may be understood that another constitutional element, e.g., the 3$^{rd}$ constitutional element is not present between the certain constitutional element and the different constitutional element.

The expression "configured to" used in the present disclosure may be interchangeably used with, for example, "suitable for", "having the capacity to", "designed to", "adapted to", "made to", or "capable of" according to a particular situation. A term "configured to" may not imply only "specially designed to" in a hardware manner. Instead, in certain situations, the expression "a device configured to" may imply that the device is "capable of" together with other devices or components. For example, "a processor configured to perform A, B, and C" may imply a dedicated processor, e.g., an embedded processor, for performing a corresponding operation or a generic-purpose processor, e.g., central processing unit (CPU) or application processor (AP), capable of performing corresponding operations by executing one or more software programs stored in a memory device.

Terms used in the present disclosure are for the purpose of describing particular embodiments only and are not intended to limit other embodiments. A singular expression may include a plural expression unless there is a contextually distinctive difference. Unless otherwise defined, all terms, including technical and scientific terms, used herein have the same meaning as commonly understood by those of ordinary skill in the art to which various embodiments of the present disclosure belong. It will be further understood that terms, such as those defined in commonly used dictionaries, should be interpreted as having a meaning that is consistent with their meaning in the context of the relevant art, and will not be interpreted in an idealized or overly formal sense unless expressly so defined herein. Optionally, the terms defined in the present disclosure should not be interpreted to exclude the embodiments of the present disclosure. A capacitor array of the present disclosure may include at least one capacitor, and each capacitor constituting the capacitor array may be coupled to a switch so as to be controlled according to on/off of the switch.

The present disclosure relates to a technique of controlling an analog-digital conversion.

An analog-digital converter (ADC) may be used to convert an analog signal into a digital signal. A successive approximation register (SAR) ADC is one type of the ADC, and is characterized by a relatively simple structure and a low power consumption. A method for implementing the SAR ADC includes a split-capacitor array structure for operating the ADC by splitting a capacitor. In order to decrease chip size and power consumption, the split-capacitor array structure uses a bridge capacitor to use a most significant bit (MSB)-digital-analog converter (DAC) and a least significant bit (LSB)-DAC in a split manner. When using the split-capacitor array structure, the bridge capacitor used to split all capacitors of the ADC has a small value, and thus there may be a matching difference between a capacitor array of the MSB-DAC and a capacitor array of the LSB-DAC. A correction of the bridge capacitor overcomes the matching difference. For the correction of the bridge capacitor, a trim capacitor is adjusted based on a digital value comparison.

FIG. 1 illustrates a structure of an apparatus for controlling an ADC according to an embodiment of the present disclosure.

An electronic device for correcting the ADC according to an embodiment of the present disclosure includes an LSB-DAC 110, a bridge capacitor 120, an MSB-DAC 130, a comparator 140, a controller 150, and a trim capacitor 160. The controller 150 includes an SAR logic unit 153 and a correction unit 151.

The LSB-DAC 110 and the MSB-DAC 130 convert a digital signal into an analog signal. The LSB-DAC 110 and the MSB-DAC 130 output the digital signal as the analog signal based on the digital signal received from the controller 150. For example, the LSB-DAC 110 receives a digital signal from the controller 150 and outputs an analog signal, e.g., voltage, based on the received digital signal. In addition, the MSB-DAC 130 receives a digital signal from the controller 150 and outputs an analog signal, e.g., voltage, based on the received digital signal. For example, regarding the LSB-DAC 110, a capacitor array state of the LSB-DAC 110 is determined according to a first digital signal of the controller 150, and a voltage signal is output according to a capacitor value corresponding to the determined capacitor array state. Likewise, regarding the MSB-DAC 130, a capacitor array state of the MSB-DAC 130 is determined according to a second digital signal of the controller 150, and a voltage signal is output according to a capacitor value corresponding to the determined capacitor array state.

The bridge capacitor 120 connects the LSB-DAC 110 and the MSB-DAC 130. The electronic device uses the bridge capacitor 120 to separate respective arrays of the LSB-DAC 110 and the MSB-DAC 130. In addition, the input of the comparator 140 combines a voltage signal output from the LSB-DAC 110 as an output voltage signal of the MSB-DAC 130. For example, a signal generated by combining the output voltage signal of the LSB-DAC 110 and the output voltage signal of the MSB-DAC 130 is used as an input signal of the comparator 140. For example, the generated signal is a voltage signal corresponding to a digital output code based on the combination of capacitors connected to the LSB-DAC 110 and the MSB-DAC 130.

When the voltage output by the LSB-DAC 110 is combined with the voltage output by the MSB-DAC 130, an error may occur because of capacitor mismatch and parasitic capacitance of the bridge capacitor 120 in an output voltage delivery process, and a trim capacitor is corrected to decrease the error caused by the bridge capacitor 120.

A comparator 140 compares the input voltage signal and a voltage signal corresponding to the combination of the LSB-DAC 110 and the MSB-DAC 130. The input voltage signal may be a sampling signal of an input signal, or a voltage signal acquired by applying a reference voltage $V_{refp}$ to a unit capacitor 210 (FIGS. 2A and 4A) coupled with a capacitor array of the MSB-DAC 130 to correct the bridge capacitor, or a voltage signal acquired after the reference voltage $V_{refp}$ is applied to all capacitors constituting a capacitor array of the LSB-DAC 110. The reference voltage $V_{refp}$ is a maximum voltage that can be output from the LSB-DAC 110 or the MSB-DAC 130.

The comparison result is output as a code value of 0 or 1 according to a criterion, e.g., if the input voltage signal is greater than a voltage signal corresponding to the digital code, the output value is 1, and otherwise is 0. In the alternative, if the input voltage signal is greater than the voltage signal corresponding to the digital code, the output value may be 0, and otherwise, with an output value of 1.

The controller 150 performs an overall control for correction and analog-digital conversion, with the SAR logic unit 153 of the controller 150 controlling the analog-digital conversion and storing a digital value. The SAR logic unit 153 converts an analog value into a digital value sequentially in 1 bit units using a binary search algorithm. The SAR logic unit 153 controls the LSB-DAC 110 and the MSB-DAC 130 to store a value of each bit by comparing analog signals in order of MSB to LSB, and converts the analog values into digital values using the stored digital value.

When the SAR logic unit 153 compares voltages of two inputs via the comparator 140, a comparison error may occur due to a change in an input value because of physical noise, a capacitor value mismatch, or the like caused by a bridge capacitor. To correct such an error, conventionally, a method of decreasing the comparison error by adjusting an offset of the comparator 140 is used. When the offset of the comparator 140 is adjusted, circuit complexity increases. Instead of adjusting the offset of the comparator 140, the present disclosure adjusts a trim capacitor value by using the correction unit 151 to correct the mismatch of the capacitor value.

The correction unit 151 receives a digital value from the SAR logic unit 153, and then performs the correction by comparing the received digital value. More specifically, the correction unit 151 samples a reference value at the unit capacitor 210 (see FIGS. 2A and 4A) of the MSC DAC 130, and then compares a digital value (hereinafter, $D_{msb}$) output by the SAR logic unit 153 based on a value output via the comparator 140 with respect to a sample value and a digital value (hereinafter, $D_{lsb}$) output by the SAR logic unit 153 based on a value output via the comparator 140 by sampling a reference value at all capacitors of the LSB-DAC 110. The correction unit 151 compares the $D_{msb}$ and the $D_{lsb}$ to generate a value for controlling the trim capacitor 160.

A value of a capacitor belonging to the trim capacitor 160 changes based on a control value received via the correction unit 151. The change in the value of the trim capacitor 160 results in a change in a sum of capacitances of the trim capacitor 160, the LSB-DAC 110, and the bridge capacitor 120, thereby obtaining the same effect as correcting the bridge capacitor 120.

According to an embodiment of the present disclosure, in order to perform an analog-digital conversion and correction of an error in an electronic device, including a communication device, a reference voltage $V_{refp}$ is applied for sampling in a state where a switch coupled to the unit capacitor 210 of the MSB-DAC 130 is on, and an output value of the SAR logic unit 153 may be acquired based on an output value of the sampling. Further, the reference value $V_{ref}$ is applied to perform sampling in a state where switches coupled to all capacitors of the LSB-DAC 110 are on, and then acquires an output value of the SAR logic unit 153 based on an output value of the sampling.

Figure 2A:
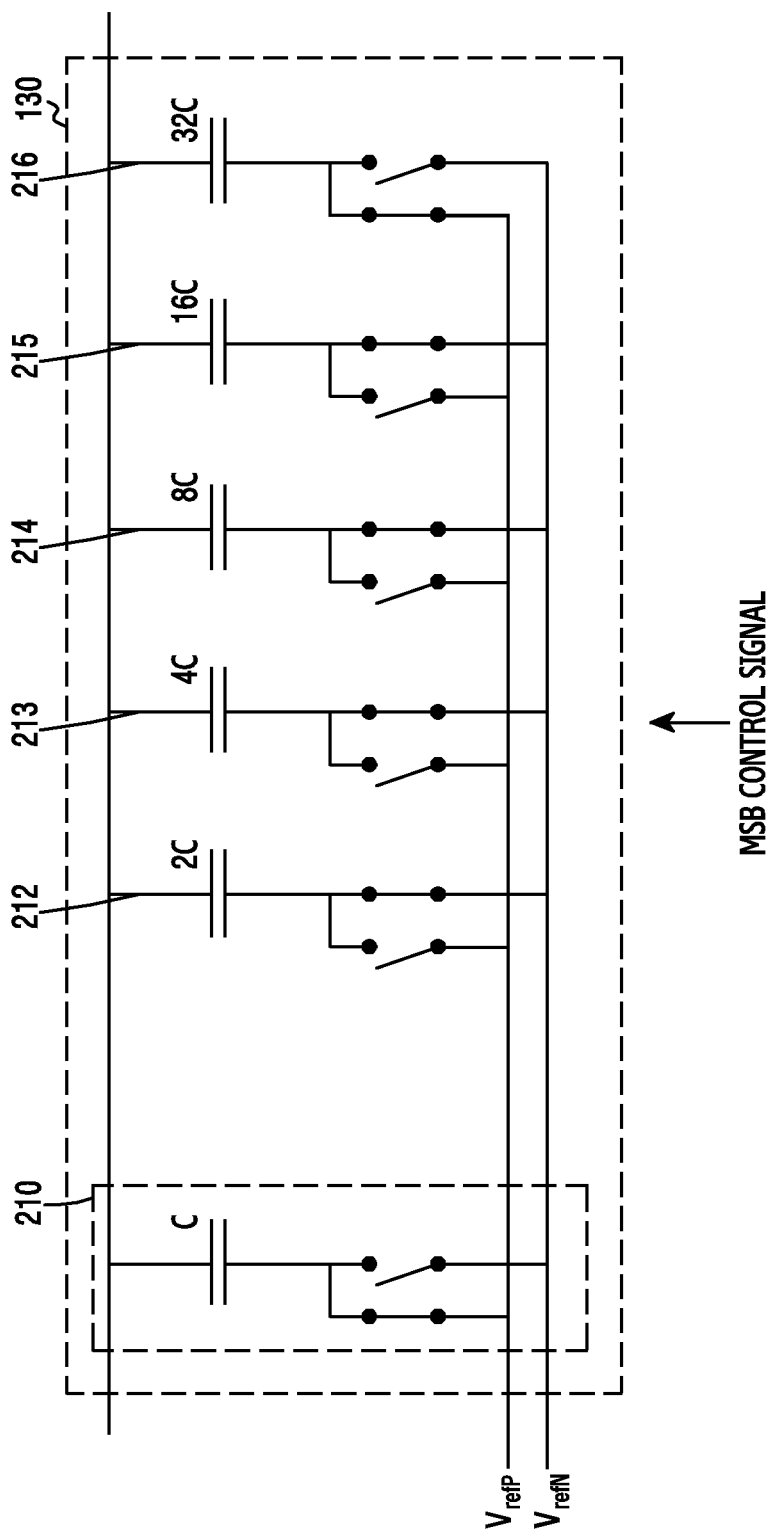
FIG. 2A illustrates a structure of a most significant bit (MSB)-digital-analog converter (DAC) 130 according to an embodiment of the present disclosure.

FIG. 2A illustrates a structure of the MSB-DAC 130 according to an embodiment of the present disclosure.

Referring to FIG. 2A, the MSB-DAC 130 consists of an MSB capacitor array. The MSB capacitor array includes the unit capacitor 210, and a plurality of capacitors 212, 213, 214, 215, and 216. The unit capacitor 210 is used to correct the aforementioned bridge capacitor, and may not be used when the bridge capacitor is not corrected.

Five capacitors are shown in FIG. 2A, other than the unit capacitor 210, as an example only. The number of the plurality of capacitors 212, 213, 214, 215, and 216 is not limited thereto, and can vary depending on a level of resolution desired in the apparatus.

According to an embodiment of the present disclosure, to correct the bridge capacitor for coupling the LSB-DAC 110 and the MSB-DAC 130 in a split SAR ADC, the LSB-DAC 110 and the MSB-DAC 130 are separately sampled and the respective sample values are then compared via the SAR logic unit 153 to perform the correction based thereon.

Figure 2B:
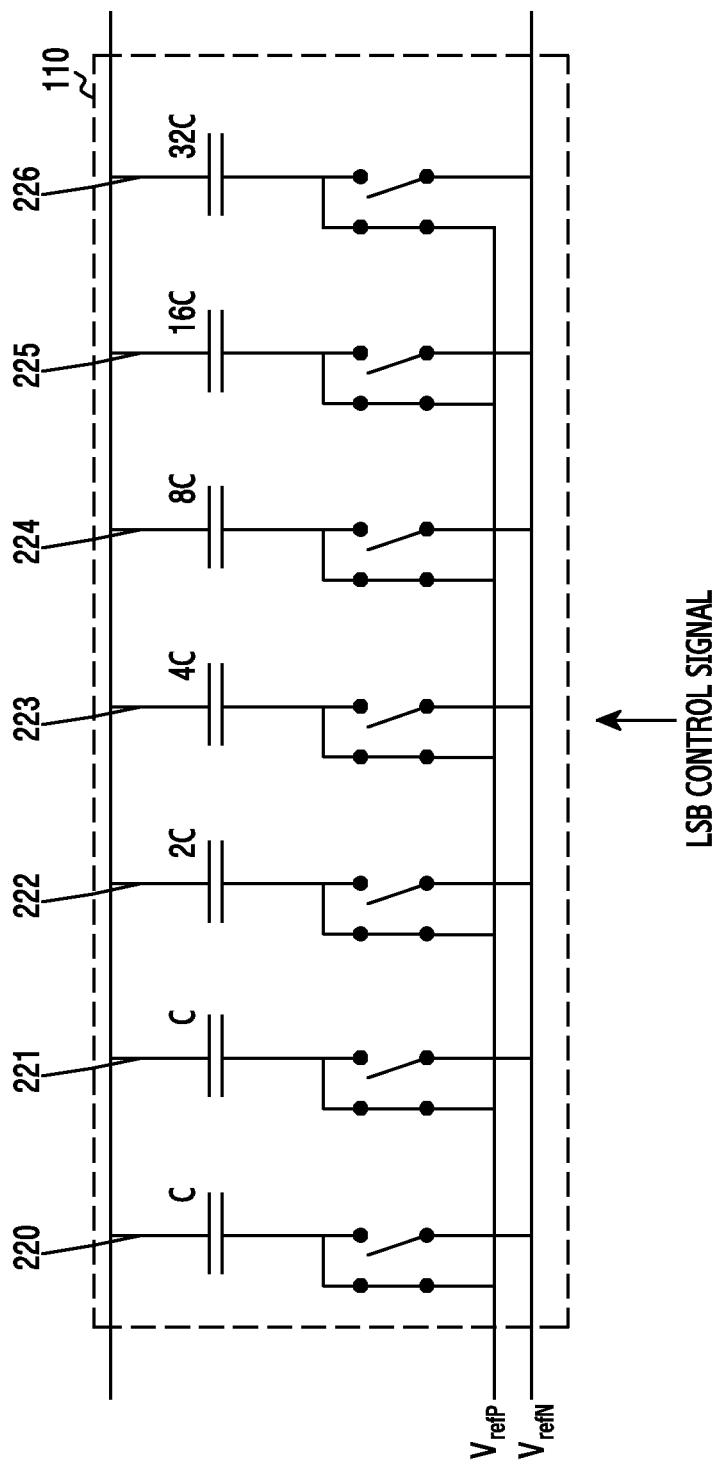
FIG. 2B illustrates a structure of a least significant bit (LSB)-DAC 110 according to another embodiment of the present disclosure.

FIGS. 2A and 2B illustrate an example in which each of the MSB-DAC 130 and the LSB-DAC 110 consists of a 6-bit converter. Bits of the MSB-DAC 130 and the LSB-DAC 110 are combined to perform a 12-bit conversion function. Although a 12-bit SAR ADC is exemplified in the present disclosure, this is only to facilitate an understanding and the number of bits may vary depending on the embodiments, with the present disclosure not being limited to the 12-bit SAR ADC. For conciseness, the present disclosure is described using the 12-bit SAR ADC as an example.

A reference voltage $V_{refp}$ is sampled at the unit capacitor 210 of the MSB-DAC 130 to correct the bridge capacitor. The reference voltage is sampled at the unit capacitor 210 of the MSB-DAC 130. Since each DAC performs a 6-bit conversion, a minimum voltage may be 1/64 (i.e., 26=64) of the reference value. Therefore, if the reference sample $V_{refp}$ is sampled at the unit capacitor 210 of the MSB-DAC 130, an output voltage through the unit capacitor is $V_{refp}/64$. As a result, an output to the MSB-DAC 130 is 000001, and an output to the LSB-DAC 110 may have a form of 000000 since a voltage is not applied yet. An output value $D_{msb}$ for the MSB-DAC 130 and the LSB-DAC 110 via the SAR logic unit may reach 000001000000.

FIG. 2B illustrates a structure of the LSB-DAC 110 according to an embodiment of the present disclosure.

Referring to FIG. 2B, the LSB-DAC 110 consists of an LSB capacitor array. The LSB capacitor array may include a dummy capacitor 220, and may include a plurality of capacitors 221, 222, 223, 224, 225, and 226. Although seven capacitors are shown, this is for exemplary purposes only. The number of the plurality of capacitors is not limited thereto, and thus may vary depending on exemplary aspects of the present disclosure.

Similar to FIG. 2A, FIG. 2B illustrates an example in which each of the MSB-DAC 130 and the LSB-DAC 110 consists of a 6-bit converter. Bits of the MSB-DAC 130 and the LSB-DAC 110 are combined to perform a 12-bit conversion function.

In order to perform the correction, a reference voltage $V_{refp}$ is sampled in a state where switches of all capacitors 220, 221, 222, 223, 224, 225, and 226 are on. If the reference voltage is sampled with all capacitors 220, 221, 222, 223, 224, 225, and 226 of the LSB-DAC 110 turned, with a minimum unit of voltage is 6 bits ($2^6$=64), a minimum voltage is 1/64 of the reference value. Therefore, if the reference voltage $V_{refp}$ is applied to all capacitors of the LSB-DAC 110, an output voltage on the LSB-DAC 100 is equal to the reference voltage $V_{refp}$, in a state which all of the plurality of capacitors 220, 221, 222, 223, 224, 225, and 226 are connected (i.e., 1/64×64=1). Therefore, if the reference voltage is applied to all capacitors 220, 221, 222, 223, 224, 225, and 226 of the LSB-DAC 110, a decimal value of 63, i.e., 63C, is output via the LSB-DAC 110, equal to a value obtained by adding an additional bit 000001 to an output value 111111, since a sum of a capacitor array of the LSB-DAC 110 has a decimal value of 64, with the plurality of capacitors 220, 221, 222, 223, 224, 225, and 226 having values of C, C, 2C, 4C, 8C, 16C, and 32C, respectively, for a total of 64C. Accordingly, an output value of the LSB-DAC is 111111+000001. That is, the LSB-DAC has a value 000000 in which 1 bit is overflowed to an MSB-DAC, and thus a digital output value $D_{lsb}$ via the SAR logic unit 150 is 000001000000. However, due to a matching difference between the capacitors of the MSB-DAC 130 and the capacitors of the LSB-DAC 110, the $D_{lsb}$ is output as a value other than 000001000000. For example, the $D_{lsb}$ may be output as a value greater than 000001000000, for example, a value of 000001000001. In order to correct such error, the trim capacitor 160 is adjusted based on a comparison of the $D_{msb}$ and the $D_{lsb}$ for the error correction.

Figure 3A:
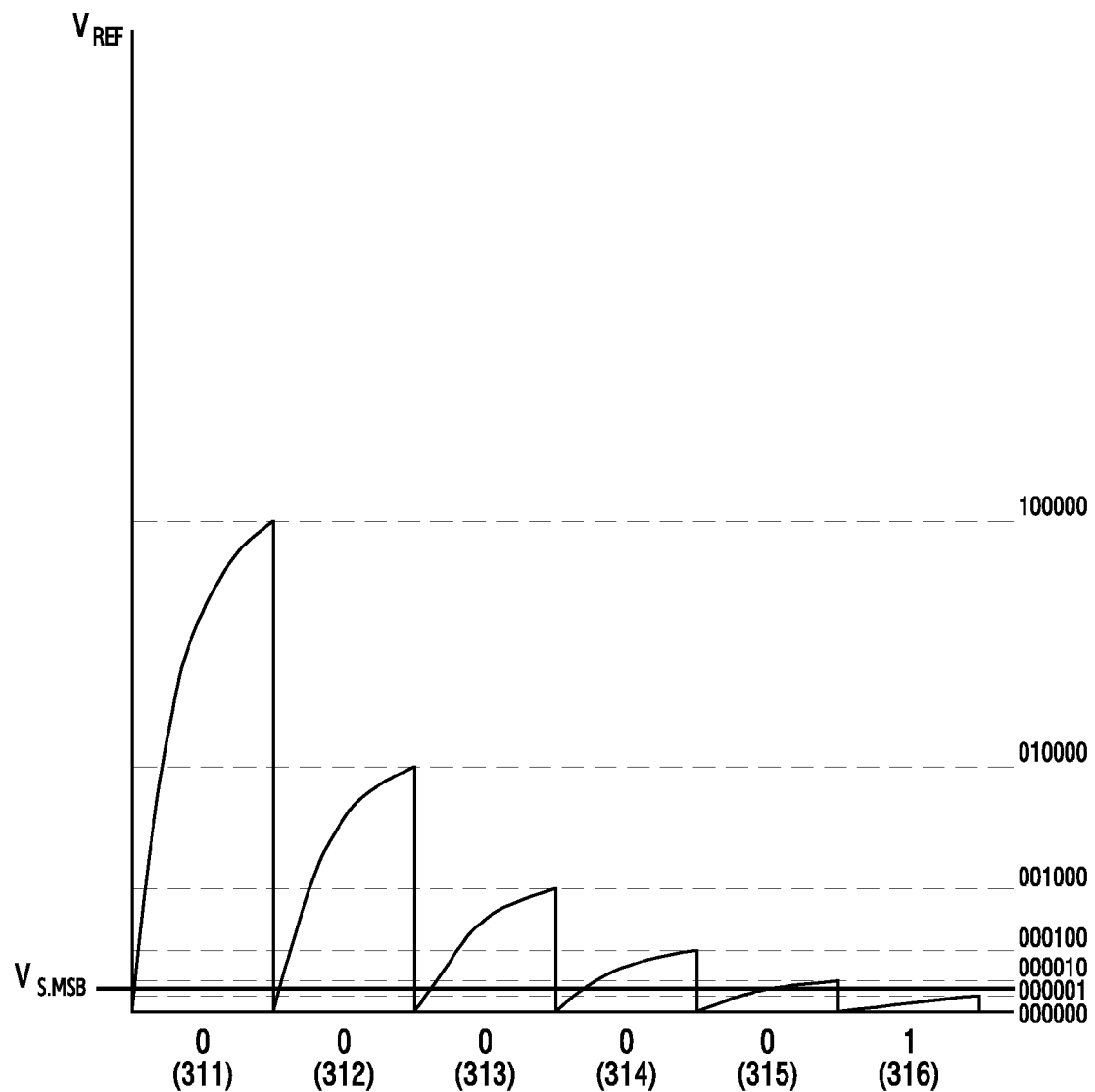
FIG. 3A and FIG. 3B illustrate an example of acquiring a digital value by comparing a sample voltage and a DAC output voltage according to an embodiment of the present disclosure.
Figure 3B:
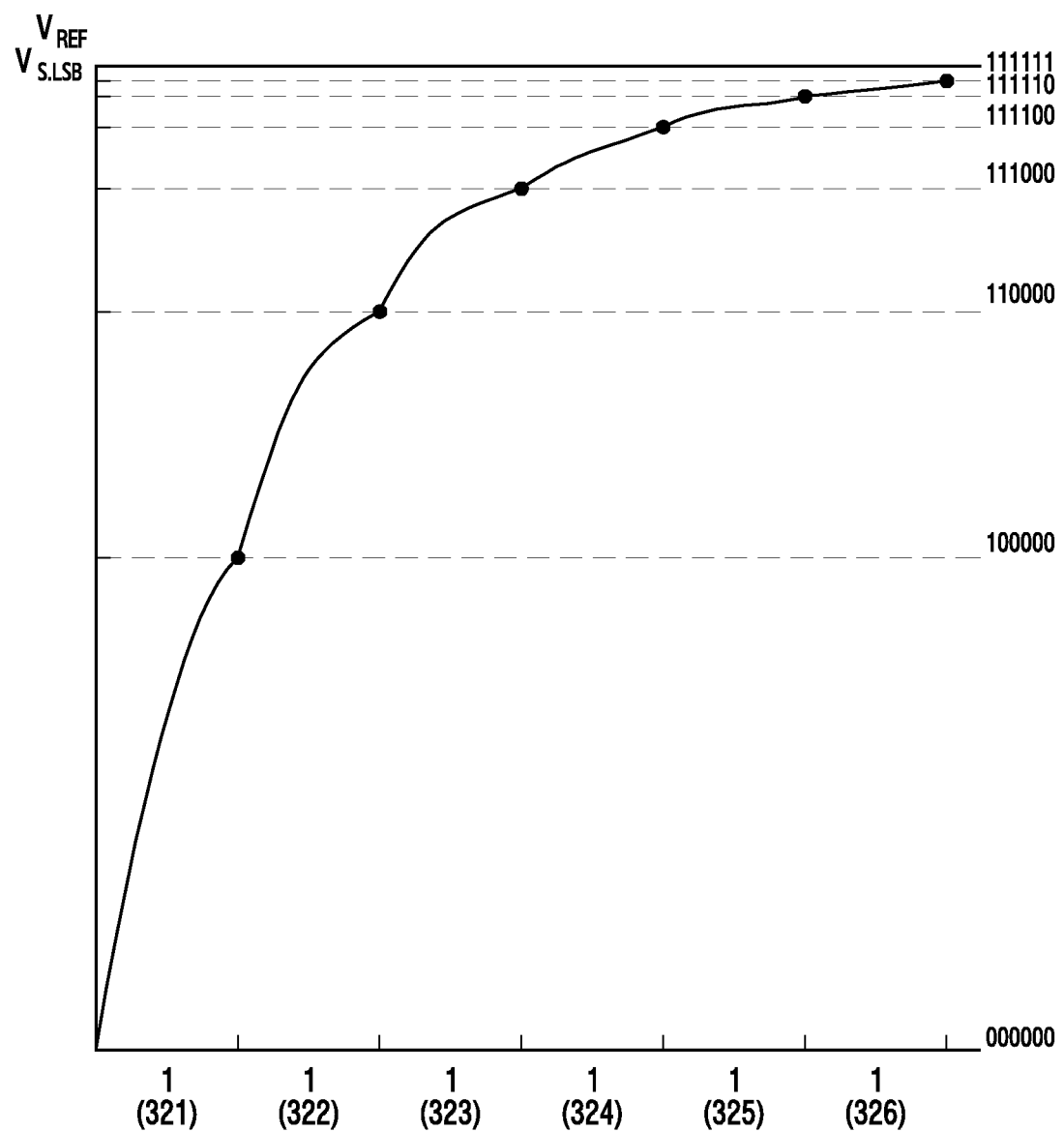

FIG. 3A and FIG. 3B illustrate an example of acquiring a digital value by comparing a sampled voltage and a DAC output voltage according to an embodiment of the present disclosure, with the abscissa and ordinate of FIG. 3A and FIG. 3B showing intervals of passage of time and voltage, respectively.

FIG. 3A illustrates a procedure of acquiring a digital value of a sampled voltage in a state where a switch of the unit capacitor 210 of the MSB-DAC 130 is on. Referring to FIG. 3A, in interval 311, a sampled voltage $V_{S,MSB}$ and a voltage value $V_{32C}$ are compared in a state where the 32C capacitor 216 of the MSB-DAC 130 is switched on. The state where the 32C capacitor 216 is switched on is equal to a state where a reference voltage $V_{REF}$ is divided by two. As a result of the comparison, the $V_{S,MSB}$ is less than the $V_{32C}$, and thus a value output via the comparator 140 is 0.

In interval 312, the sampled voltage $V_{S,MSB}$ and a voltage $V_{16C}$ are compared when the 32C capacitor 216 is switched off and the 16C capacitor 215 is switched on. As a result of the comparison, the sampled voltage $V_{S,MSB}$ is less than the $V_{16C}$, and thus a value output via the comparator 140 is 0.

Likewise, when comparing the sampled voltage $V_{S,MSB}$ and each voltage in a state where the 8C capacitor 214 is switched on in interval 313, in a state where the 4C capacitor 213 is switched on in interval 314, and in a state where the 2C capacitor 212 is switched on in interval 315, as a result of the comparison, the sampled voltage $V_{S,MSB}$ is 10 lower than a voltage value in a state where each capacitor is switched on, and thus a value output via the comparator 140 is also 0.

In interval 316, the sampled voltage $V_{S,MSB}$ is compared with a voltage $V_{1C}$ in a state where the 1C capacitor 210 is switched on. In this case, as a result of the comparison, the sampled voltage $V_{S,MSB}$ is higher than the $V_{1C}$, and thus a value output via the comparator 140 is 1. Eventually, a result of summing output values via the MSB-DAC 130 is 000001, and the output result is summed up by being stored in the SAR logic unit 153. Since it is a state where a voltage is not applied to the LSB-DAC, an output value in this case is 000001000000.

FIG. 3B illustrates a procedure of acquiring a digital value of a sampled voltage in a state where switches of all capacitors of the LSB-DAC 110 are on. Referring to FIG. 3B, in interval 321, a sampled voltage $V_{S,LSB}$ and a voltage value $V_{32C}$ are compared in a state where the 32C capacitor 226 of the LSB-DAC 110 is switched on. The state where the 32C capacitor 226 is switched on is equal to a state where a reference voltage $V_{REF}$ is divided by 1/2. As a result of the comparison, the $V_{S,LSB}$ is less than the $V_{32C}$, and thus a value output via the comparator 140 is 1.

In interval 322, the sampled voltage $V_{S,LSB}$ and the voltage $V_{16C}$ are compared in a state where the 32C capacitor 226 is switched off and the 16C capacitor 225 is switched on. s a result of the comparison, the sampled voltage $V_{S,LSB}$ is less than the $V_{16C}$, and thus a value output via the comparator 140 is 1.

Likewise, the sampled voltage $V_{S,LSB}$ is compared with each voltage in interval 323 in a state where the 32C capacitor 226 and the 16C capacitor 225 are switched off and the 8C capacitor 224 is switched on, in interval 324 in a state where the 32C capacitor 226, the 16C capacitor 225, and the 8C capacitor 224 are switched off and the 4C capacitor 223 is switched on, in interval 325 in a state where the 32C capacitor 226, the 16C capacitor 225, the 8C capacitor 224, and the 4C capacitor 223 are switched off and the 2C capacitor 222 is switched on, and in interval 326 in a state where the 32C capacitor 226, the 16C capacitor 225, the 8C capacitor 224, the 4C capacitor 223, and the 2C capacitor 222 are switched off and the 1C capacitor 221 is switched on. As a result of the comparison, the sampled voltage $V_{S,LSB}$ is lower than a voltage value in a state where each capacitor is switched on, and thus a value output via the comparator 140 is also 1.

The output result is summed up by being stored in the SAR logic unit 153, and a sum of outputs via the LSB-DAC is 111111. A voltage value sampled to this value is 64C, which is greater than a value obtained by filling the each of the 6 bits, and thus is equal to a value obtained by adding 000001 to the sum of the outputs. Therefore, an overflow occurs when 000001 is added to 111111, and since it is a state where a voltage is not applied to the LSB-DAC, an output value in this case is 000001000000.

Figure 4A:
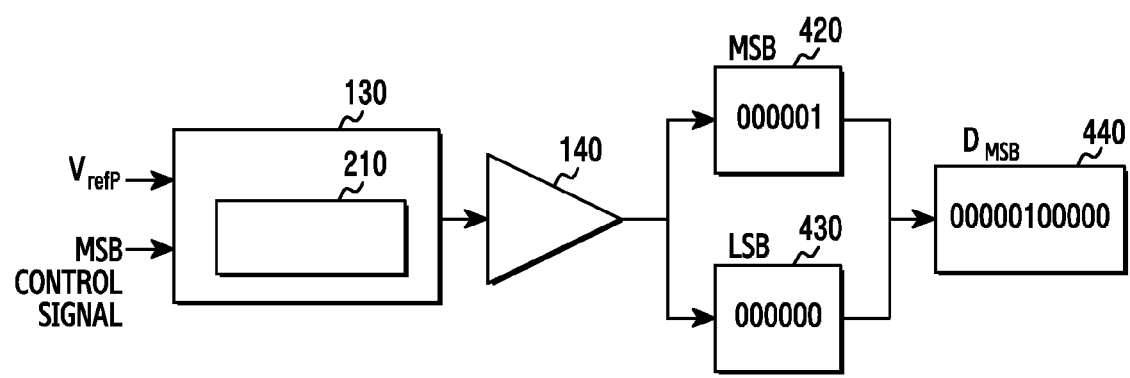
FIG. 4A and FIG. 4B illustrate examples of an output result based on each DAC sample according to an embodiment of the present disclosure.
Figure 4B:
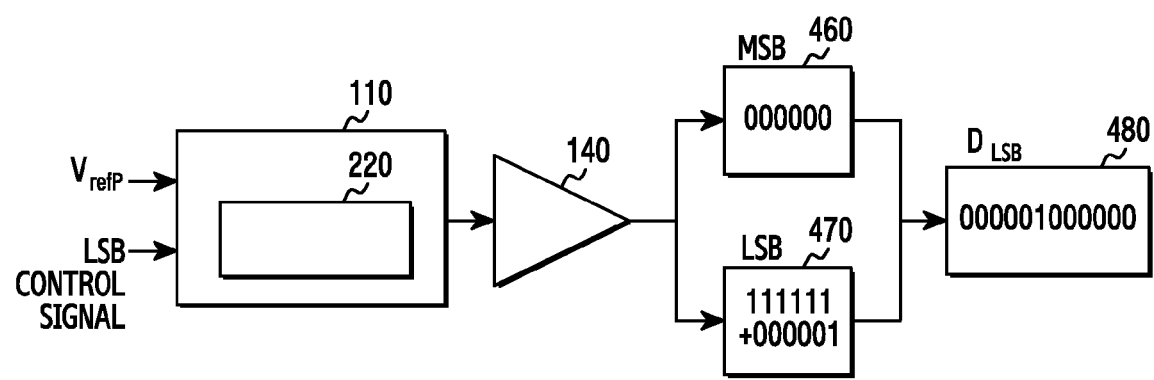

FIG. 4A and FIG. 4B illustrate examples of an output result based on each DAC sample according to an embodiment of the present disclosure.

FIG. 4A illustrates an example of a result of output values according to FIG. 2A nd FIG. 3A. Referring to FIG. 4A, when a reference voltage $V_{refp}$ is applied by switching on the unit capacitor 210 of the MSB-DAC 130, a sample voltage is a minimum voltage, i.e., $V_{refp}/64$, and as a result, a digital result value 420 of the MSB-DAC 130 is 000001. Since it is equivalent that a voltage is not applied to the LSB-DAC 110, a digital result value 430 of the LSB-DAC 110 is 000000. Eventually, an output value 440 for the sample voltage obtained by switching on the unit capacitor 210 of the MSB-DAC 130 is 000001000000.

FIG. 4B illustrates an example of a result of output values according to FIG. 2B and FIG. 3B. Referring to FIG. 4B, when a reference voltage $V_{refp}$ is applied by switching on the dummy capacitor 220 of the LSB-DAC 110a sample voltage is $V_{refp}$ which is equal to a reference voltage, and as a result, a digital result value 470 of the LSB-DAC 110 corresponds to 64C having a value beyond 6 bits. That is, due to an overflow, a digital result value of the LSB-DAC 110 is a value obtained by adding a single-digit bit number 000001 to 111111. Therefore, a value obtained by switching on all capacitors 210, 221, 20 222, 223, 224, 225, 226 of the LSB-DAC 110 is 000000, and adding 111111 and 000001, with 000001 in the MSB-DAC due to an overflow of the LSB-DAC even though a voltage is not applied to the MSBDAC. That is, an output value 480 for a sample voltage which is a sum of a digital result value 470 of the LSB-DAC and a digital result value 460 the MSB-DAC of 000001000000.

Figure 5:
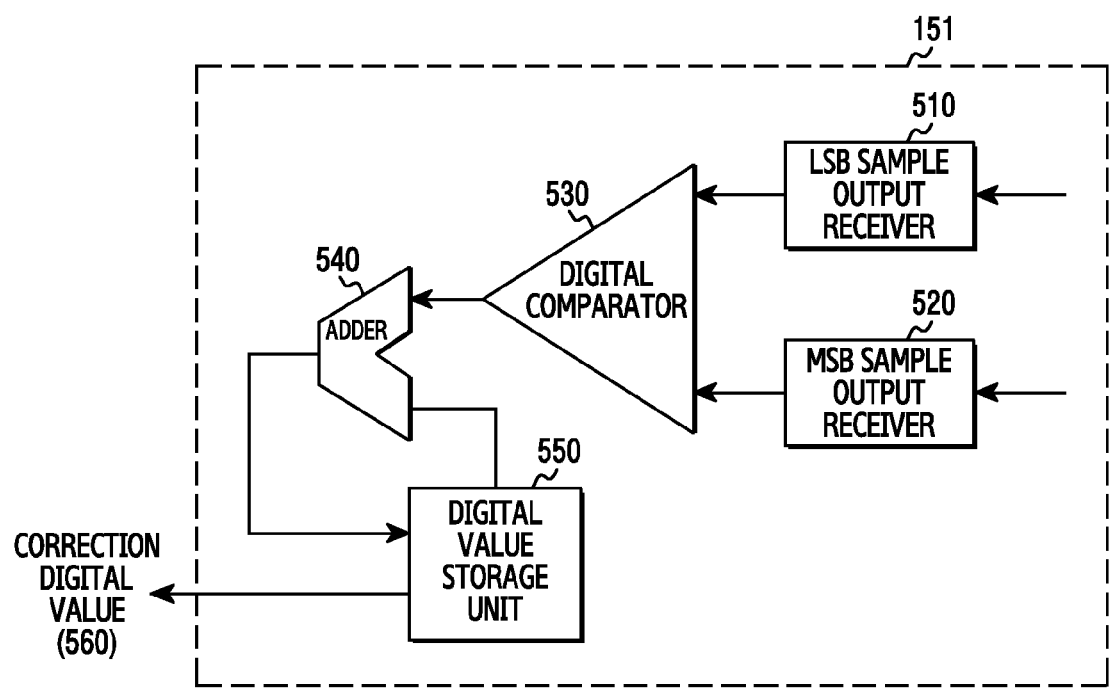
FIG. 5 illustrates a structure of a correction unit according to an embodiment of the present disclosure.

FIG. 5 illustrates a structure of a correction unit according to an embodiment of the present disclosure.

Referring to FIG. 5, the correction unit 151 includes an LSB sample output receiver 510, an MSB sample output receiver 520, a digital comparator 530, an adder 540, and a digital value storage unit 550. In a state where all capacitors of the LSB-DAC 110 are switched on via the LSB sample output receiver 510, the digital comparator 530 receives an input of a digital value $D_{lsb}$ acquired via the SAR logic unit 153 by sampling a reference voltage. Further, when the unit capacitor of the MSB-DAC 130 is switched on via the MSB sample output receiver 520, the digital comparator 530 receives a digital value $D_{msb}$ acquired via the SAR logic unit 153 by sampling the reference voltage.

The correction performed by the correction unit 151 maintains a specific ratio of the LSB-DAC 110 and the MSB-DAC 130. To perform the correction of the SAR ADC, an error must not occur in a voltage value which is input to the comparator 140. A cause of the error of the input voltage value may be a physical noise which occurs in a device, a delay caused by a bridge capacitor, or the like. Instead of adjusting an offset of the comparator or adjusting each individual capacitor to remove the aforementioned error, the present disclosure corrects the error by comparing digital result values output from the LSB-DAC 110 and the MSB-DAC 130, and performs a correction such that the digital result values satisfy a specific criterion within a specific range. The error is corrected by adjusting a value of the trim capacitor 160 according to the digital result values. The adjusting of the value of the trim capacitor 160 results in a change in a sum of capacitance of the trim capacitor 160, all capacitors of the LSB-DAC 110, and the bridge capacitor 120, and the bridge capacitor 120 is corrected as a result thereof.

The digital comparator 530 compares magnitudes of values input to the LSB sample output receiver 510 and the MSB sample output receiver 520. If a value is input via the LSB sample output receiver 510 that is greater than a value input via the MSB sample output receiver 520, the digital comparator 530 outputs 1, otherwise the digital comparator 530 outputs 0.

The adder 540 adds values output from the digital comparator 530. If an output value of the digital comparator 530 is 0, an addition value is 0, and thus the adder 540 outputs a value which is the same as a case of not performing the addition. Otherwise, if the output value of the digital comparator 530 is 1, addition is performed, and a digital value stored in the digital value storage unit 550 is increased by 1. The addition result value is output as a correction digital value 560. The correction digital value 560 is used as a value for correcting the trim capacitor 160. The addition is performed until a magnitude of a value input to the LSB sample output receiver 510 is not greater than a magnitude of a value input to the MSB sample output receiver 520.

The operation of the correction unit 151 is summarized as follows, based on the aforementioned content. The correction unit 151 initializes the trim capacitor 160 before performing the correction operation. The correction unit 151 uses the digital comparator 530 to compare a digital output value $D_{lsb}$ acquired from the SAR logic unit 153 by sampling a reference voltage in a state where all capacitors of the LSB-DAC 110 are switched on and a digital value $D_{msb}$ acquired from the SAR logic unit 153 by sampling the reference voltage in a state where a unit capacitor 210 of the MSB-DAC 130 is switched on. If the value $D_{lsb}$ is greater than the value $D_{msb}$, the correction unit 151 increases a value of the trim capacitor 160 by one As a method of increasing the value of the trim capacitor 160, when a correction digital value is pre-stored, the correction digital value 560 for correcting the trim capacitor 160 is output by adding a result of the adder 540 to the correction digital value pre-stored in the digital value storage unit 550. The correction is performed until the value $D_{lsb}$ is not greater than the value $D_{msb}$.

Values which are input to the comparator through the correction, that is, a value which is output by being sampled to the reference voltage in a state where the unit capacitor 210 of the MSB-DAC 130 is switched on and a value which is output by being sampled to the reference voltage in a state where all capacitors of the LSB-DAC 110 are switched on, may be identical within a voltage error range corresponding to a least bit of the MSB-DAC.

Figure 6:
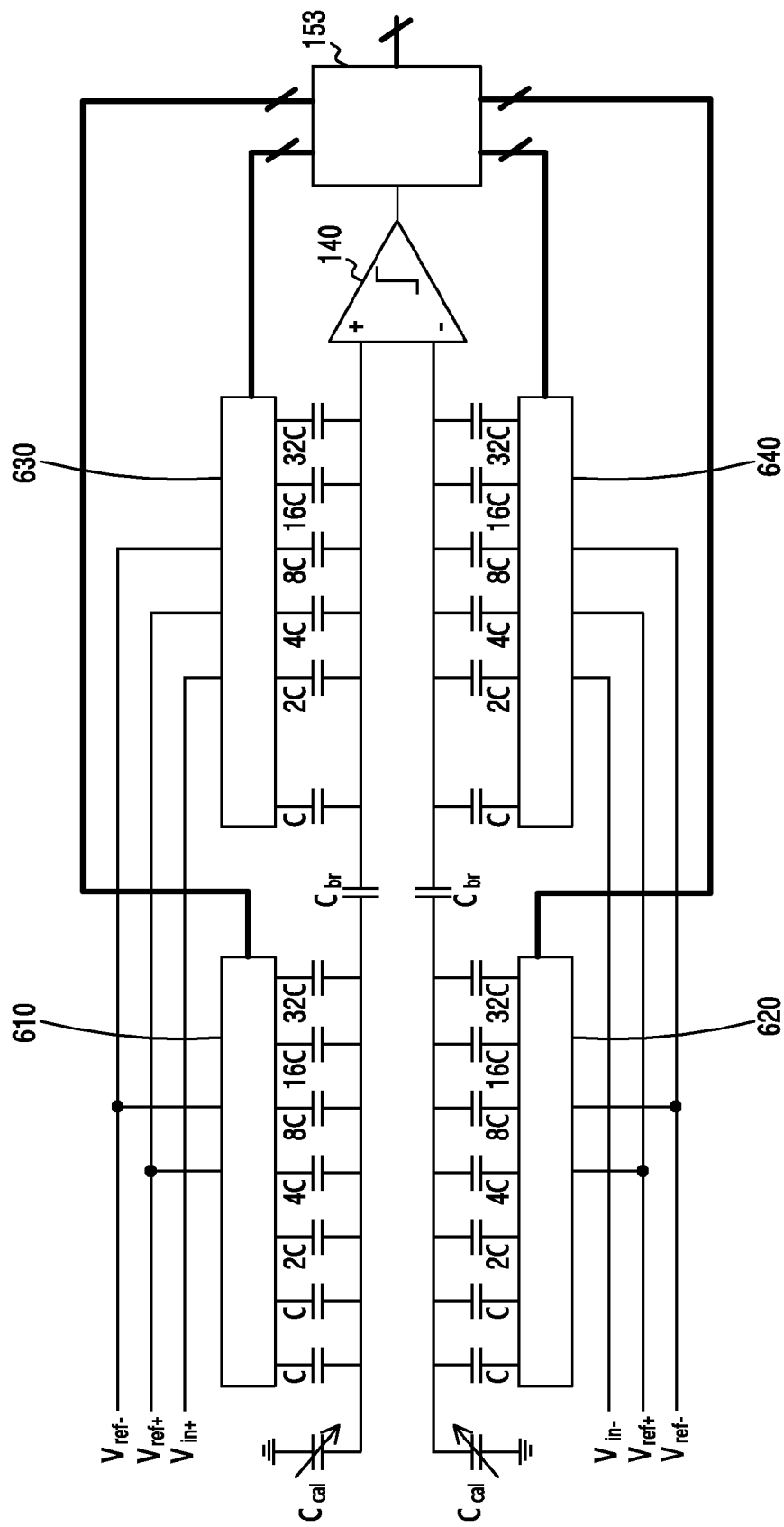
FIG. 6 illustrates an ADC operation according to another embodiment of the present disclosure.

FIG. 6 illustrates an ADC operation according to another embodiment of the present disclosure.

FIG. 2A and FIG. 2B show one LSB-DAC 110 and one MSB-DAC 130. In another embodiment, as shown in FIG. 6, a first LSB-DAC 610 and a first MSB-DAC 630 are connected to a positive (+) input of a comparator 140 and a second LSB-DAC 620 and a second MSB-DAC 640 connected to a negative (−) input of comparator 140. As shown in FIG. 6, a first bridge capacitor $C_{br-1}$ connects the first LSB-DAC 610 to the first MSB-DAC 630, and a second bridge capacitor $C_{br-2}$ connects the second LSB-DAC 620 to the second MSB-DAC 640. When a positive (+) voltage is applied to the comparator 140, an input of a negative (−) voltage side is a ground input, and when a negative (−) voltage is applied to the comparator 140, an input of a positive (+) voltage side is a ground input, with an overall operation of the electronic communication device and the SAR logic unit 153 being similar to the operations described above with reference to FIG. 2A to FIG. 5.

Figure 7:
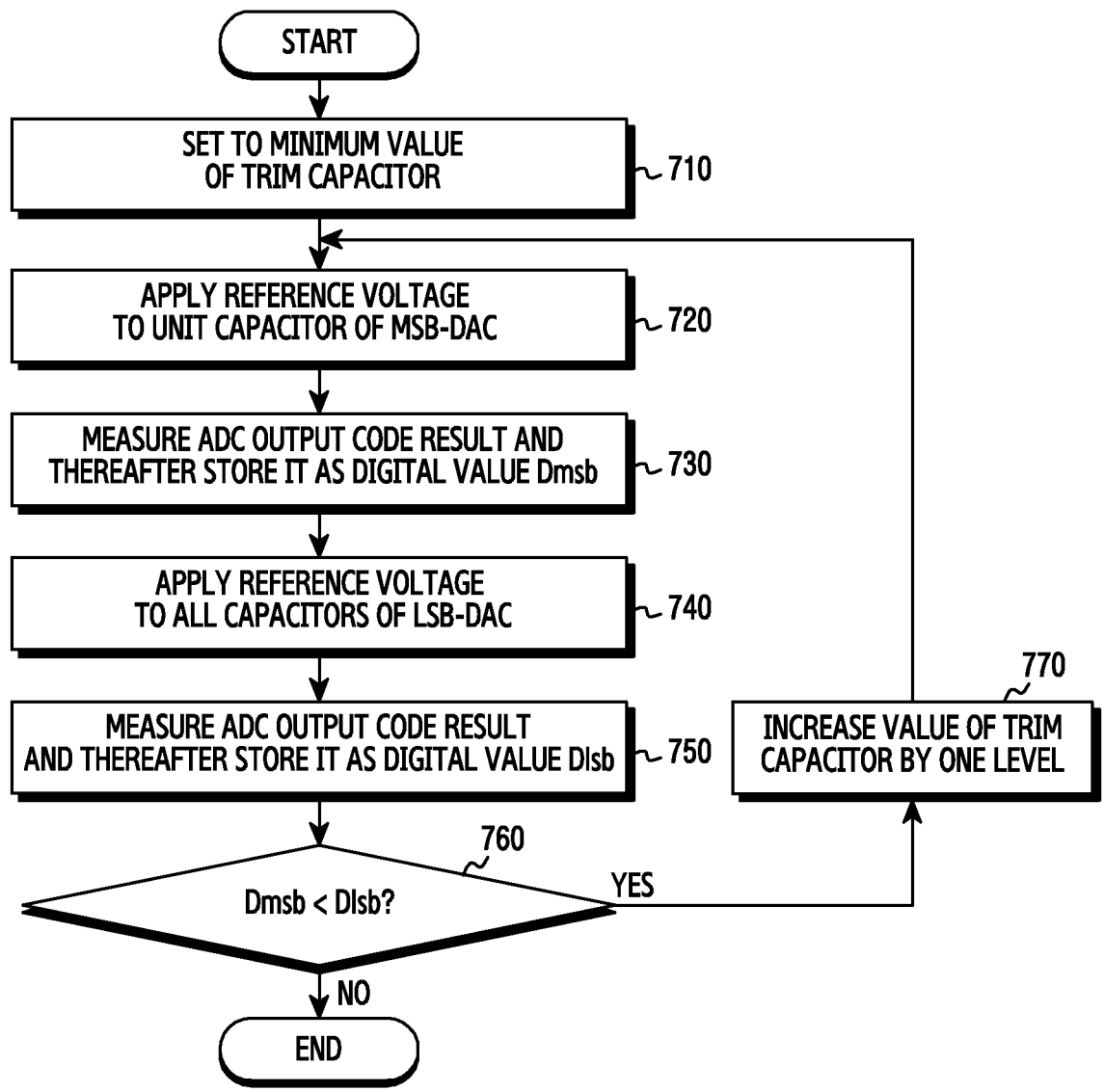
FIG. 7 is a flowchart illustrating a procedure of an ADC correction according to an embodiment of the present disclosure.

FIG. 7 is a flowchart illustrating a procedure of an ADC correction according to an embodiment of the present disclosure.

Referring to FIG. 7, in step 710, an initial value of the trim capacitor 160 is set to a minimum value. In various embodiments, the initial value of the trim capacitor 160 may be determined to a median value or a maximum value.

In step 720, a sampling is performed in a state where the unit capacitor 210 of the MSB-DAC 130 is switched on. In step 730, an ADC output voltage code result is measured and stored as a digital value $D_{msb}$ for an output voltage of the MSB-DAC 130 according to a reference voltage sampled in a state where the unit capacitor of the MSB-DAC 130 is switched on.

In step 740, the reference voltage is applied to all capacitors of the LSB-DAC 110, i.e., all capacitors of the LSB-DAC 110 are switched on. In step 750, an ADC output code result is measured and stored as a digital value $D_{lsb}$ for an output voltage for the LSB-DAC 110 according to a reference voltage sampled in a state where all capacitors of the LSB-DAC 110 are switched on.

In step 760, the value $D_{msb}$ and the value $D_{lsb}$ are compared. If the value $D_{lsb}$ is greater than the value $D_{msb}$, in step 770, a value of a trim capacitor is increased by one. The communication device may perform an ADC correction by increasing a value of the trim capacitor until the value $D_{lsb}$ is equal to the value $D_{msb}$. For example, if the value $D_{lsb}$ is greater than value $D_{msb}$, an input voltage lower than a previous input voltage is applied to the comparator 140 by increasing the value of the trim capacitor 160. With a decrease in the input voltage of the comparator 140, the value $D_{lsb}$ may be smaller than the previous value.

Figure 8:
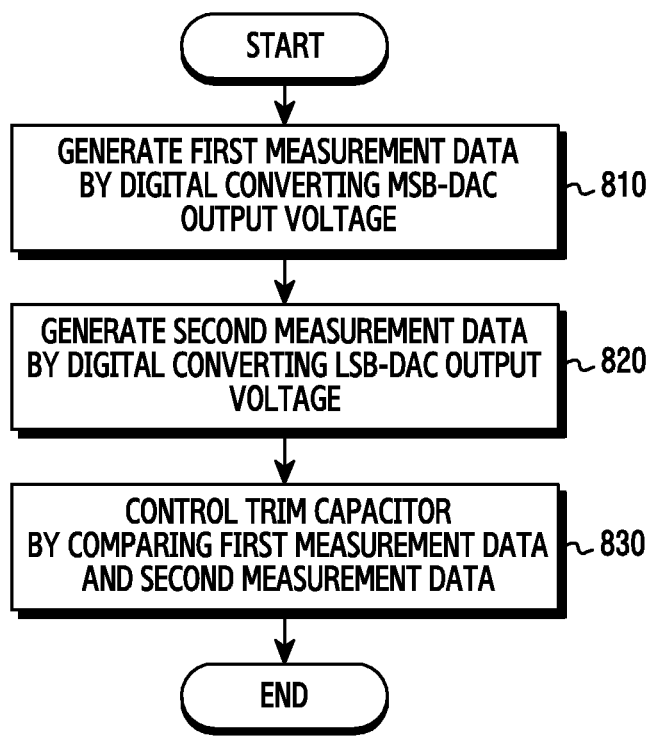
FIG. 8 is a flowchart illustrating a procedure of an ADC control according to another embodiment of the present disclosure.

FIG. 8 is a flowchart illustrating a procedure of an ADC control according to an embodiment of the present disclosure.

Referring to FIG. 8, in step 810, first measurement data is generated by digital converting an MSB-DAC output voltage. By sampling a reference voltage at the unit capacitor 210 of the MSB-DAC 130, a digital output value is acquired with respect to a voltage output via the MSB-DAC 130, with the first measurement data obtained when only a least bit of an MSB side is on and all bits of an LSB side are off.

In step 820, second measurement data is generated by digital converting an LSB-DAC output voltage. By sampling a reference voltage at all capacitors of the LSB-DAC 110, a digital output value is acquired with respect to a voltage output via the LSB-DAC 110, that is, the second measurement data in a state where all bits of an LSB side are on and all bits of an MSB side are off.

In step 830, the first measurement data and the second measurement data are compared. Sizes of the first measurement data which is a digital output value with respect to a voltage output via the MSB-DAC 130 are compared with the second measurement data which is a digital output value with respect to a voltage output via the LSB-DAC 110, and if the second measurement data has a larger size, a trim capacitor value is adjusted.

Figure 9:
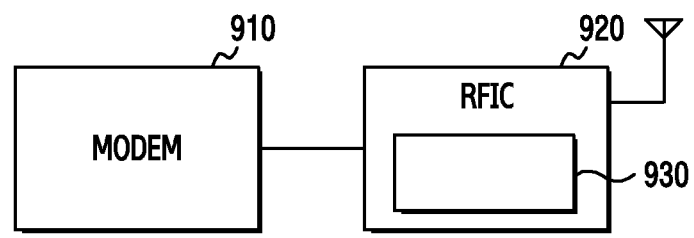
FIG. 9 is a block diagram illustrating an electronic communication device according to an embodiment of the present disclosure.

FIG. 9 is a block diagram illustrating an electronic communication device according to an embodiment of the present disclosure.

Referring to FIG. 9, the communication device includes a modem 910 and a Radio Frequency Integrated Chip (RFIC) 920. The modem 910 modulates a baseband signal according to a corresponding communication scheme and outputs the signal to the RFIC 920, or receives a baseband signal from the RFIC 920 and demodulates the signal according to a corresponding communication scheme.

The RFIC 920 may convert a baseband signal output from the modem into an RF signal and may output the signal to an antenna, or may convert an RF signal received from the antenna into a baseband signal and may output the signal to the modem. According to an embodiment of the present disclosure, the RFIC 920 may include an SAR ADC 930. The SAR ADC 930 may allow an analog signal to be transmitted through a digital conversion. Herein, the SAR ADC 930 is the apparatus for controlling the ADC, as described in FIG. 1.

FIGS. 10A-10D illustrate simulation results according to the present disclosure.

Figure 10A:
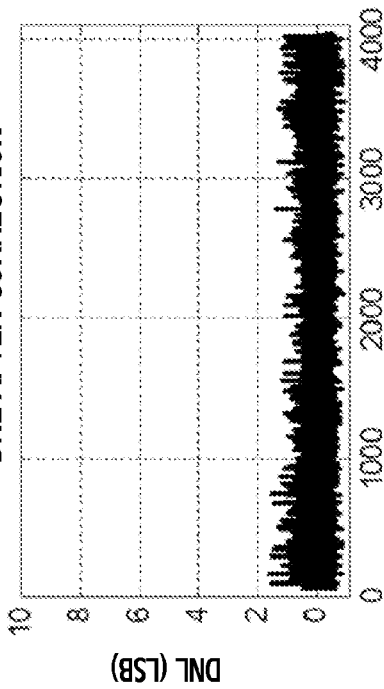
FIGS. 10A-10D illustrate simulation results according to the present disclosure.
Figure 10B:
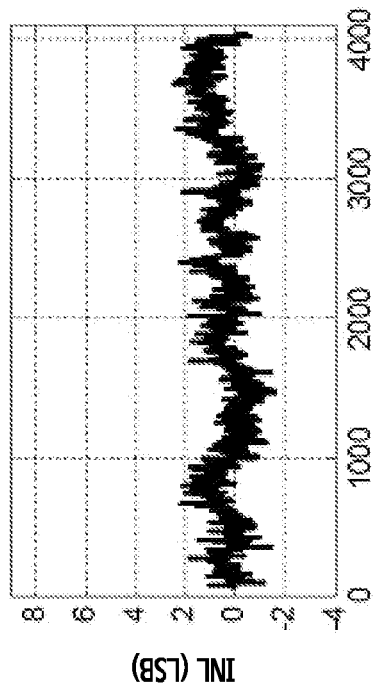
Figure 10C:
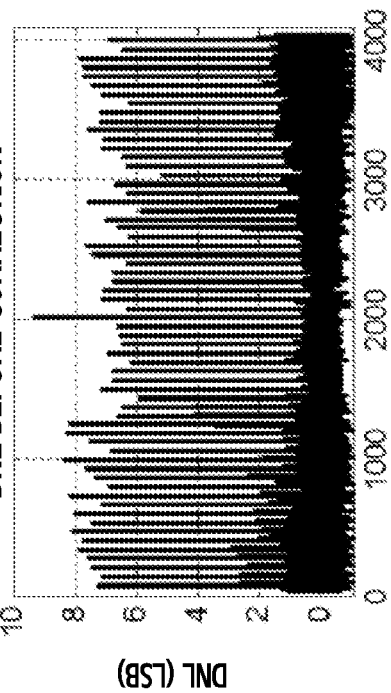
Figure 10D:
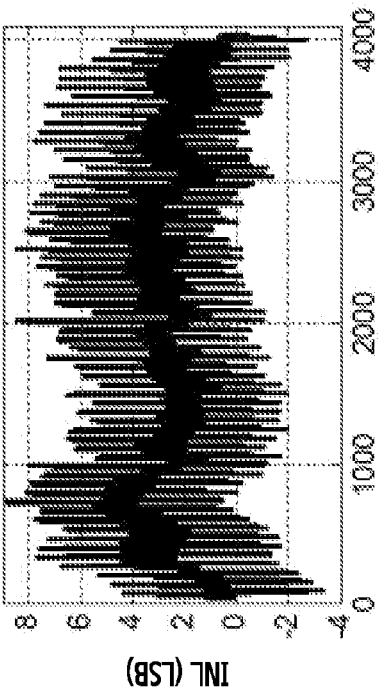

The vertical axis of FIGS. 10A and 10B denotes Differential NonLinearity (DNL), and the vertical axis of FIGS. 10C and 10D denotes Integral NonLinearity (INL). Referring to FIGS. 10A and 10B, it can be seen that a range of the DNL for each code of the DNL after correction is decreased in comparison with the DNL before correction. In addition, referring to FIGS. 10C and 10D, it can be seen that a range of the INL for each code of the INL after correction is decreased in comparison with the INL before correction.

According to an embodiment of the present disclosure, a correction of an Analog-Digital Converter (ADC) device can be carried out irrespective of an offset of a comparator by performing an ADC control.

Methods based on the embodiments disclosed in the claims and/or specification of the present disclosure can be implemented in hardware, software, or a combination of both.

When implemented in software, computer readable recording medium for storing one or more programs, i.e., software modules, can be provided. The one or more programs stored in the computer readable recording medium are configured to be executed by one or more processors in an electronic device. The one or more programs include instructions for allowing the electronic device to execute the methods based on various embodiments disclosed in the claims and/or specification of the present disclosure.

The program, i.e., the software module or software, can be stored in a random access memory, a non-volatile memory including a flash memory, a Read Only Memory (ROM), an Electrically Erasable Programmable Read Only Memory (EEPROM), a magnetic disc storage device, a Compact Disc-ROM (CD-ROM), Digital Versatile Discs (DVDs) or other forms of optical storage devices, and a magnetic cassette. Alternatively, the program can be stored in a memory configured in combination of all or some of these storage media. In addition, the configured memory may be plural in number.

Further, the program can be stored in an attachable storage device capable of accessing the electronic device through a communication network such as the Internet, an Intranet, a Local Area Network (LAN), a Wide LAN (WLAN), or a Storage Area Network (SAN) or a communication network configured by combining the networks. The storage device can access the electronic device via an external port. In addition, an additional storage unit on a communication network can access a device for performing an embodiment of the present disclosure.

In the aforementioned specific example embodiments of the present disclosure, a constitutional element is expressed in a singular or plural form according to the specific example embodiment described herein. However, the singular or plural expression is selected properly for a situation described for the convenience of explanation, and thus the invention is not limited to a single or a plurality of constitutional elements. Therefore, a constitutional element expressed in a plural form can also be expressed in a singular form, or vice versa.

While the present disclosure has been particularly shown and described with reference to certain embodiments thereof, it will be understood by those skilled in the art that various changes in form and details may be made therein without departing from the spirit and scope of the present invention as defined by the appended claims.

What is claimed is:

1. An apparatus for analog-to-digital conversion, the apparatus comprising:
    a most significant bit digital-to-analog converter (MSB-DAC) for converting a first digital signal into a first analog signal;
    a least significant bit digital-to-analog converter (LSB-DAC) for converting a second digital signal into a second analog signal;
    a bridge capacitor for connecting the MSB-DAC and the LSB-DAC;
    a comparator for measuring a voltage value corresponding to a combination of the MSB-DAC and the LSB-DAC, and for outputting a result of a comparison of the measured voltage value with a sample voltage value; and
    a controller for controlling analog-to-digital conversion of a first measurement value output from the comparator by applying a reference voltage to a unit capacitor of the MSB-DAC to generate first measurement data, and analog-to-digital conversion of a second measurement value output from the comparator by applying the reference voltage to the LSB-DAC to generate second measurement data.

2. The apparatus of claim 1, further comprising a trim capacitor connected in parallel with the LSB-DAC, wherein the trim capacitor is controlled based on a comparison of the first measurement data and the second measurement data.

3. The apparatus of claim 1, wherein the bridge capacitor is connected between the MSB-DAC and the LSB-DAC in series.

4. The apparatus of claim 1, wherein the MSB-DAC includes a unit capacitor and the LSB-DAC includes a dummy capacitor.

5. The apparatus of claim 1, wherein the first measurement data is generated by activating a unit capacitor of the MSB-DAC and by deactivating all remaining capacitors of the MSB-DAC.

6. The apparatus of claim 1, wherein the second measurement data is generated by activating all capacitors of the LSB-DAC.

7. The apparatus of claim 1, wherein the controller compares a value of the first measurement data and a value of the second measurement data and, if the value of the second measurement data is greater than the value of the first measurement data, increases a value of a trim capacitor.

8. The apparatus of claim 1, wherein the controller compares a value of the first measurement data and a value of the second measurement data, and if the value of the second measurement data is greater than the value of the first measurement data, continues to measure the LSB-DAC and the MSB-DAC.

9. The apparatus of claim 1, wherein the controller compares a value of the first measurement data and a value of the second measurement data, and if the value of the second measurement data is less than or equal to the value of the first measurement data, stops measuring the LSB-DAC and the MSB-DAC.

10. A method for operating an analog-to-digital converter, the method comprising:
    applying a reference voltage value to a unit capacitor of a most significant bit-digital-to-analog converter (MSB-DAC) for converting a first digital signal into a first analog signal to measure a voltage output from the MSB-DAC, and for generating first measurement data by analog-to-digital conversion of a first measurement value; and
    applying a reference voltage value to a least significant bit-digital-to-analog converter (LSB-DAC) for converting a second digital signal into a second analog signal to measure a voltage output from the LSB-DAC, and for generating second measurement data by analog-to-digital conversion of a second measurement value.

11. The method of claim 10, wherein the LSB-DAC is connected with a trim capacitor in parallel, wherein the trim capacitor is controlled based on a comparison of the first measurement data and the second measurement data.

12. The method of claim 10, wherein the MSB-DAC and the LSB-DAC are connected via a bridge capacitor in series.

13. The method of claim 10, wherein the MSB-DAC includes a unit capacitor and the LSB-DAC includes a dummy capacitor.

14. The method of claim 10, wherein generating the first measurement data comprises activating a unit capacitor of the MSB-DAC and deactivating all remaining capacitors of the MSB-DAC.

15. The method of claim 10, wherein generating the second measurement data comprises activating all capacitors of the LSB-DAC.

16. The method of claim 10, further comprising comparing a value of the first measurement data and a value second measurement data, and if the value of the second measurement data is greater than the value of the first measurement data, increasing a value of a trim capacitor.

17. The method of claim 10, further comprising comparing a value of the first measurement data and a value of the second measurement data, and if the value of the second measurement data is greater than the value of the first measurement data, continuing to measure the LSB-DAC and the MSB-DAC.

18. The method of claim 10, further comprising comparing a value of the first measurement data and a value of the second measurement data, and if the value of the second measurement data is less than or equal to the value of the first measurement data, stopping the measuring of the LSB-DAC and the MSB-DAC.

19. A method of operating a communication device comprising a radio frequency integrated chip (RFIC) with a successive approximation register analog-to-digital converter, the method comprising:

modulating, by a modem of the communication device, a baseband signal according to a communication scheme for wireless communication;

converting, by a most significant bit digital-to-analog converter (MSB-DAC) of the RFIC, a first digital signal into a first analog signal;

converting, by a least significant bit digital-to-analog converter (LSB-DAC) of the RFIC, a second digital signal into a second analog signal;

measuring, by a comparator of the RFIC, a voltage value corresponding to a combination of the MSB-DAC and the LSB-DAC;

outputting, by the comparator, a result of a comparison of the measured voltage value with a sample voltage value;

analog-to-digital converting, by a controller of the RFIC, a first measurement value output from the comparator by applying a reference voltage to a unit capacitor of the MSB-DAC to generate first measurement data; and analog-to-digital converting, by the controller, a second measurement value output from the comparator by applying the reference voltage to the LSB-DAC to generate second measurement data.

20. The method of claim 19, further comprising comparing a value of the first measurement data and a value second measurement data, and if the value of the second measurement data is greater than the value of the first measurement data, increasing a value of a trim capacitor.

* * * * *